(12) United States Patent
Lindemann et al.

(10) Patent No.: US 11,228,284 B2
(45) Date of Patent: Jan. 18, 2022

(54) CONTROLLING PARAMETERS OF AN AMPLIFIER SYSTEM BASED ON A MEASURED PHYSICAL QUANTITY

(71) Applicant: Cirrus Logic International Semiconductor Ltd., Edinburgh (GB)

(72) Inventors: Eric Lindemann, Boulder, CO (US); Itisha Tyagi, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 10 days.

(21) Appl. No.: 16/272,215

(22) Filed: Feb. 11, 2019

(65) Prior Publication Data

US 2019/0260333 A1 Aug. 22, 2019

Related U.S. Application Data

(60) Provisional application No. 62/632,765, filed on Feb. 20, 2018, provisional application No. 62/632,793, filed on Feb. 20, 2018, provisional application No. 62/632,755, filed on Feb. 20, 2018.

(51) Int. Cl.
*H03F 1/30* (2006.01)
*H03F 13/00* (2006.01)
*G01R 27/26* (2006.01)
*G01R 27/08* (2006.01)
*H03F 3/38* (2006.01)

(52) U.S. Cl.
CPC ............... *H03F 1/30* (2013.01); *G01R 27/08* (2013.01); *G01R 27/2605* (2013.01); *G01R 27/2611* (2013.01); *H03F 13/00* (2013.01); *H03F 2200/03* (2013.01)

(58) Field of Classification Search
CPC ........ H03F 1/30; H03F 13/00; H03F 2200/03; H03F 3/187; H03F 3/45475; G01R 27/2605; G01R 27/2611; G01R 27/08
USPC .............................. 330/10, 207 A, 251, 289
See application file for complete search history.

(56) References Cited

U.S. PATENT DOCUMENTS 6,683,494 B2 * 1/2004 Stanley ................. H03F 3/2175
330/10
10,390,156 B2 * 8/2019 Khwaja ................ H04R 29/001

OTHER PUBLICATIONS

Islam, Mohammad et al., Hysteresis Independent On-Line Capacitance Measurement for Piezoelectric Stack Actuators, IEEE CCECE 2011, pp. 001149-001153.
Islam, Mohammad et al., Real Time Temperature Measurement for Multilayered Piezoelectric Stack Actuators, IEEE CCECE 2011, pp. 001194-001197.

* cited by examiner

*Primary Examiner* — Hieu P Nguyen
(74) *Attorney, Agent, or Firm* — Jackson Walker L.L.P.

(57) ABSTRACT

A method for controlling one or more parameters of an amplifier system may include receiving an indication of a physical quantity associated with the amplifier system, determining one or more parameters of the amplifier system in response to the indication, and causing the amplifier system to operate in accordance with the one or more parameters.

28 Claims, 5 Drawing Sheets

CONTROLLING PARAMETERS OF AN AMPLIFIER SYSTEM BASED ON A MEASURED PHYSICAL QUANTITY

RELATED APPLICATION

The present disclosure claims priority to U.S. Provisional Patent Application Ser. No. 62/632,755, filed Feb. 20, 2018, U.S. Provisional Patent Application Ser. No. 62/632,765, filed Feb. 20, 2018, and U.S. Provisional Patent Application Ser. No. 62/632,793, filed Feb. 20, 2018, all of which are incorporated by reference herein in their entireties.

FIELD OF DISCLOSURE

The present disclosure relates in general to a mobile device, and more particularly, to controlling parameters of an amplifier system based on a measured physical quantity.

BACKGROUND

Audio systems often include an amplifier driving a vibrational transducer. Examples of such a vibrational transducer may include, without limitation, a loudspeaker that includes a magnetic voice-coil transducer, a magnetic voice-coil transducer that mechanically vibrates a surface (e.g., a screen of a smartphone, tablet, personal computer, or other device), and a piezoelectric actuator that mechanically vibrates a surface. The vibrational transducer may, in response to an input signal received by the vibrational transducer, generate vibrational energy to vibrate the loudspeaker or surface to generate sound.

During operation of a vibrational transducer, properties of the vibrational transducer (capacitance, resistance, inductance) may change as a function of temperature and/or other environmental factors, or there may be changes from one device to another due to variations in manufacturing tolerances which in turn affect a frequency response of the audio system. Other properties that may change include an elasticity/compliance of a vibrational transducer and a coupling factor that may determine how efficiently electrical energy is converted into mechanical stress or strain in the vibrational transducer.

To illustrate, FIG. 7 illustrates a graph depicting a variation in frequency response of a piezoelectric transducer for three values of a dielectric constant corresponding to three different operating temperatures, as is known in the art.

Systems and methods are desired which maintain a stable audio performance and frequency response of a system comprising a vibrational transducer despite changes in temperature and other environmental conditions and variation due to manufacturing tolerances.

SUMMARY

In accordance with the teachings of the present disclosure, the disadvantages and problems associated with minimizing variation in an audio system response to changes in temperature and environment and variations in manufacturing process may be reduced or eliminated.

In accordance with embodiments of the present disclosure, a method for controlling one or more parameters of an amplifier system may include receiving an indication of a physical quantity associated with the amplifier system, determining one or more parameters of the amplifier system in response to the indication, and causing the amplifier system to operate in accordance with the one or more parameters.

In accordance with these and other embodiments of the present disclosure, an apparatus for controlling one or more parameters of an amplifier system may include at least one input configured to receive an indication of a physical quantity associated with the amplifier system and a controller configured to determine one or more parameters of the amplifier system in response to the indication and cause the amplifier system to operate in accordance with the one or more parameters.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1A:
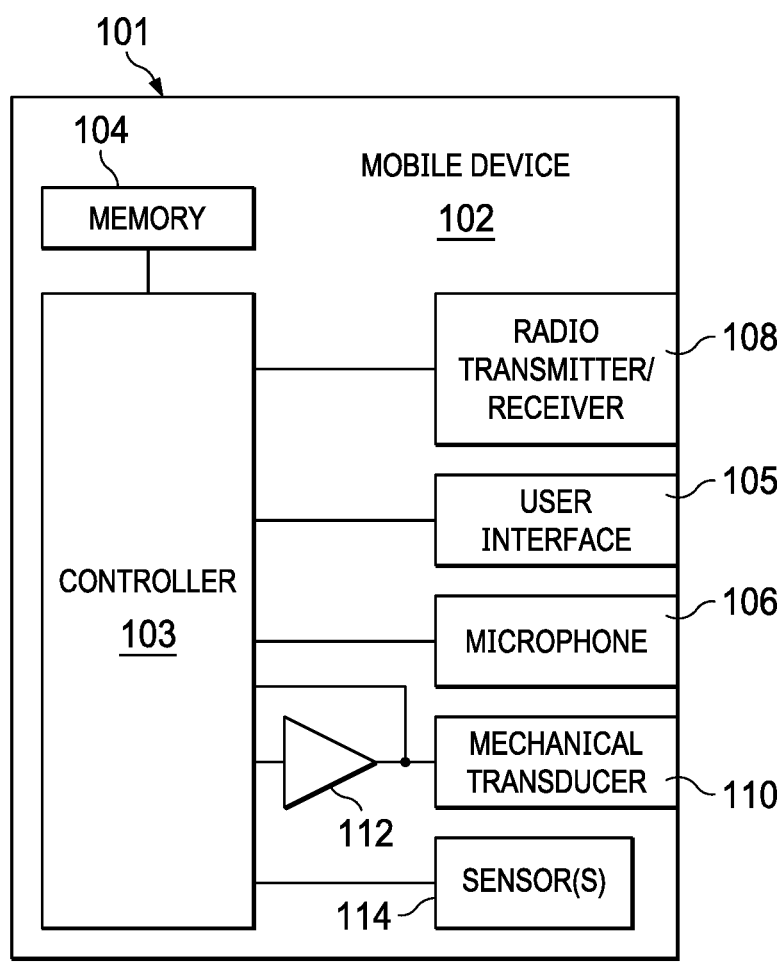
FIG. 1A illustrates a block diagram of selected components of an example mobile device, in accordance with embodiments of the present disclosure.

FIG. 1A illustrates a block diagram of selected components of an example mobile device 102, in accordance with embodiments of the present disclosure. As shown in FIG. 1A, mobile device 102 may comprise an enclosure 101, a controller 103, a memory 104, a user interface 105, a microphone 106, a radio transmitter/receiver 108, a mechanical transducer 110, an amplifier 112, and one or more sensors 114.

Enclosure 101 may comprise any suitable housing, casing, or other enclosure for housing the various components of mobile device 102. Enclosure 101 may be constructed from plastic, metal, and/or any other suitable materials. In addition, enclosure 101 may be adapted (e.g., sized and shaped) such that mobile device 102 is readily transported on a person of a user of mobile device 102. Accordingly, mobile device 102 may include but is not limited to a smart phone, a tablet computing device, a handheld computing device, a personal digital assistant, a notebook computer, or any other device that may be readily transported on a person of a user of mobile device 102.

Controller 103 is housed within enclosure 101 and may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, controller 103 may interpret and/or execute program instructions and/or process data stored in memory 104 and/or other computer-readable media accessible to controller 103.

Memory 104 may be housed within enclosure 101, may be communicatively coupled to controller 103, and may include any system, device, or apparatus configured to retain program instructions and/or data for a period of time (e.g., computer-readable media). Memory 104 may include random access memory (RAM), electrically erasable programmable read-only memory (EEPROM), a Personal Computer Memory Card International Association (PCMCIA) card, flash memory, magnetic storage, opto-magnetic storage, or any suitable selection and/or array of volatile or non-volatile memory that retains data after power to mobile device 102 is turned off.

User interface 105 may be housed at least partially within enclosure 101, may be communicatively coupled to controller 103, and may comprise any instrumentality or aggregation of instrumentalities by which a user may interact with mobile device 102. For example, user interface 105 may permit a user to input data and/or instructions into mobile device 102 (e.g., via a keypad and/or touch screen), and/or otherwise manipulate mobile device 102 and its associated components. User interface 105 may also permit mobile device 102 to communicate data to a user, e.g., by way of a display device.

Microphone 106 may be housed at least partially within enclosure 101, may be communicatively coupled to controller 103, and may comprise any system, device, or apparatus configured to convert sound incident at microphone 106 to an electrical signal that may be processed by controller 103, wherein such sound is converted to an electrical signal using a diaphragm or membrane having an electrical capacitance that varies as based on sonic vibrations received at the diaphragm or membrane. Microphone 106 may include an electrostatic microphone, a condenser microphone, an electret microphone, a microelectromechanical systems (MEMS) microphone, or any other suitable capacitive microphone.

Radio transmitter/receiver 108 may be housed within enclosure 101, may be communicatively coupled to controller 103, and may include any system, device, or apparatus configured to, with the aid of an antenna, generate and transmit radio-frequency signals as well as receive radio-frequency signals and convert the information carried by such received signals into a form usable by controller 103. Radio transmitter/receiver 108 may be configured to transmit and/or receive various types of radio-frequency signals, including without limitation, cellular communications (e.g., 2G, 3G, 4G, LTE, etc.), short-range wireless communications (e.g., BLUETOOTH), commercial radio signals, television signals, satellite radio signals (e.g., GPS), Wireless Fidelity, etc.

Mechanical transducer 110 may be housed at least partially within enclosure 101 or may be external to enclosure 101, may be communicatively coupled to controller 103 (e.g., via a respective amplifier 112), and may comprise any system, device, or apparatus made with one or more materials configured to generate electric potential or voltage when mechanical strain is applied to mechanical transducer 110, or conversely to undergo mechanical displacement or change in size or shape (e.g., change dimensions along a particular plane) when a voltage is applied to mechanical transducer 110. In some embodiments, a mechanical transducer may comprise a piezoelectric transducer made with one or more materials configured to, in accordance with the piezoelectric effect, generate electric potential or voltage when mechanical strain is applied to mechanical transducer 110, or conversely to undergo mechanical displacement or change in size or shape (e.g., change dimensions along a particular plane) when a voltage is applied to mechanical transducer 110.

In some embodiments, mechanical transducer 110 may comprise a voice coil structure similar to a dynamic loudspeaker, which employs a lightweight diaphragm mechanically coupled to a rigid frame via a flexible suspension that constrains a voice coil to move axially through a cylindrical magnetic gap. When an electrical signal is applied to the voice coil, a magnetic field is created by the electric current in the voice coil, making it a variable electromagnet. The coil and the driver's magnetic system interact, generating a mechanical force that causes the coil (and thus, the attached cone) to move back and forth, thereby reproducing sound under the control of the applied electrical signal coming from an amplifier. In other embodiments, mechanical transducer 110 may comprise a voice coil structure similar to a dynamic loudspeaker, but without a diaphragm, such that that voice coil drives mechanical vibration of a surface of mobile device 102.

A sensor 114 may comprise any suitable system, device, or apparatus configured to sense a physical quantity within mobile device 102 and generate a signal indicative of such physical quantity. For example, in some embodiments, a sensor 114 may comprise a temperature sensor 114 (e.g., a thermometer, thermistor, etc.) configured to sense a temperature within mobile device 102 (e.g., proximate to amplifier 112) and communicate a signal to controller 103 indicative of such temperature. As another example, a sensor 114 may comprise a voltage sensor configured to sense a voltage associated with mechanical transducer 110 (e.g., a voltage across terminals of mechanical transducer 110). As a further example, a sensor may comprise a current sensor configured to sense a current associated with mechanical transducer 110 (e.g., a current delivered from amplifier 112 and/or flowing through a terminal of mechanical transducer 110).

Although specific example components are depicted above in FIG. 1A as being integral to mobile device 102 (e.g., controller 103, memory 104, user interface 105, microphone 106, radio transmitter/receiver 108, mechanical transducer 110, amplifier 112, and sensor(s) 114), a mobile device 102 in accordance with this disclosure may comprise one or more components not specifically enumerated above.

Figure 1B:
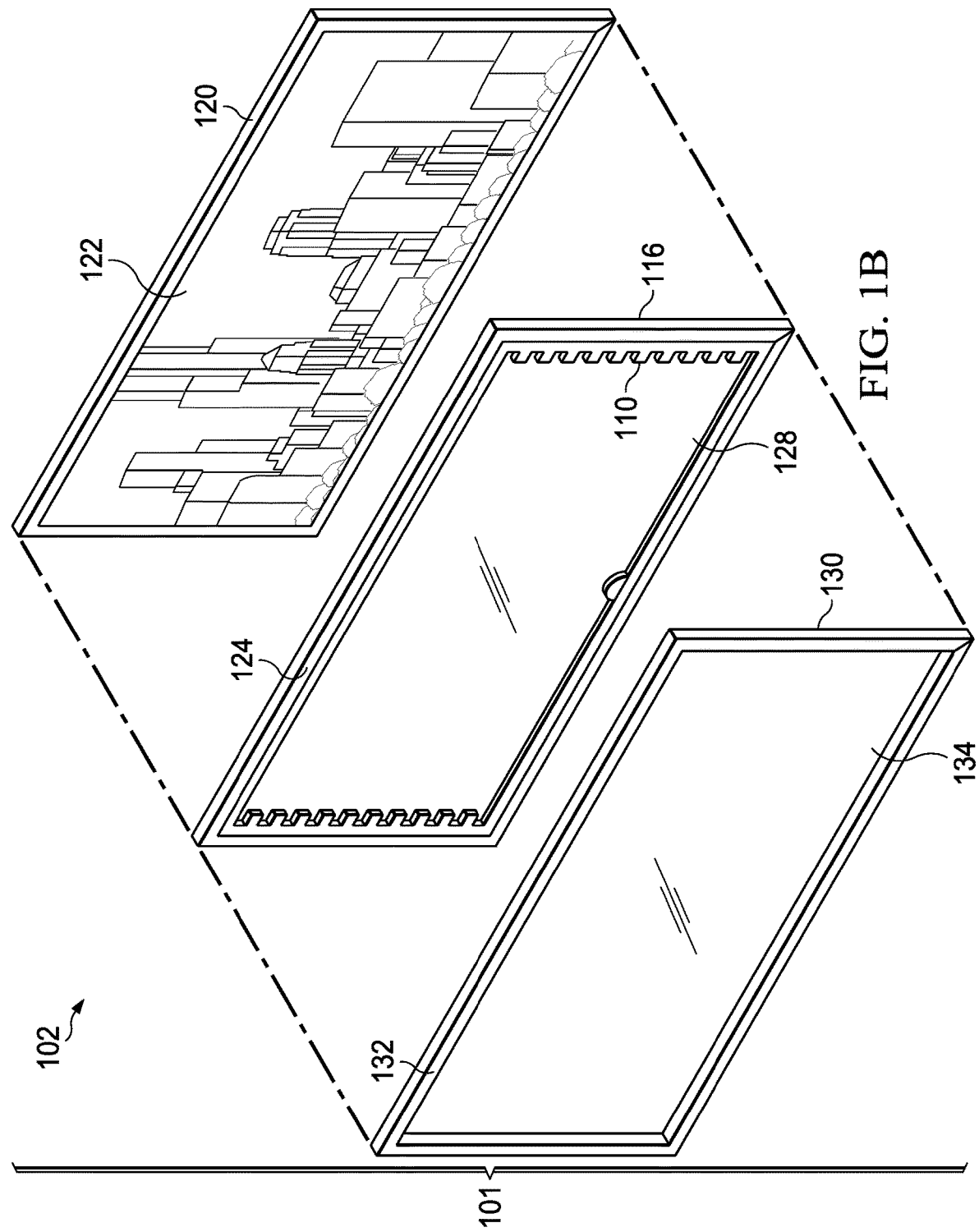
FIG. 1B illustrates an exploded perspective view of selected components of an example mobile device, in accordance with embodiments of the present disclosure.

FIG. 1B illustrates an exploded perspective view of selected components of example mobile device 102, in accordance with embodiments of the present disclosure. As shown in FIG. 1B, enclosure 101 may include a main body 120, a mechanical transducer assembly 116, and a cover assembly 130, such that when constructed, mechanical transducer assembly 116 is interfaced between main body 120 and cover assembly 130. Main body 120 may house a number of electronics, including controller 103, memory 104, radio transmitter/receiver 108, and/or microphone 106, as well as a display (e.g., a liquid crystal display) of user interface 105.

Mechanical transducer assembly 116 may comprise a frame 124 configured to hold and provide mechanical structure for one or more mechanical transducers 110 (which may be coupled to controller 103) and transparent film 128.

Cover assembly 130 may comprise a frame 132 configured to hold and provide mechanical structure for transparent cover 134. Transparent cover 134 may be made from any suitable material (e.g., ceramic) that allows visibility through transparent cover 134, protection of mechanical transducer 110 and display 122, and/or user interaction with display 122.

Although FIG. 1B illustrates mechanical transducer assembly 116 being situated between cover assembly 130 and display 122, in some embodiments, mechanical transducer assembly 116 may reside "behind" display 122, such that display 122 is situated between cover 130 and mechanical transducer assembly 116. In addition, although FIG. 1B illustrates mechanical transducer 110 located at the edge of mechanical transducer assembly 116 (and thus, at or near the edge of display 122), mechanical transducer 110 may be located at any suitable location below transparent cover 134 and/or display 122.

Mechanical transducers, including piezoelectric transducers and coil-based dynamic transducers, are typically used to convert electric signals into mechanical force. Thus, when used in connection with display 122 and/or transparent cover 134, one or more mechanical transducers 110 may cause vibration on a surface of transparent cover 134, which in turn may produce pressure waves in air, generating human-audible sound. Accordingly, in operation of mobile device 102, one or more mechanical transducers 110 may be driven by respective amplifiers 112 under the control of controller 103 in order to generate acoustical sound by vibrating the surface of transparent cover 134.

Although the foregoing contemplates the use of a mechanical transducer 110 in a mobile device 102, the systems and methods disclosed in this application may be applied generally to any other suitable vibrational transducer, including without limitation a traditional microspeaker independent of a mobile device, a standalone loudspeaker, and a loudspeaker integral to a device other than a mobile device (e.g., a television or radio).

Figure 2A:
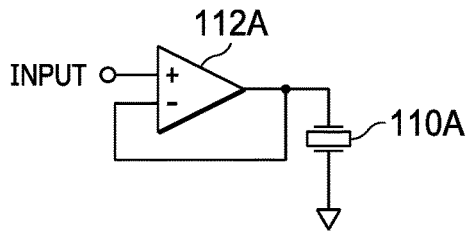
FIG. 2A illustrates a circuit diagram of an example amplifier and piezoelectric transducer for generating acoustical sound via a screen surface, in accordance with embodiments of the present disclosure.

FIG. 2A illustrates a circuit diagram of an example amplifier 112A and a mechanical transducer implemented as a piezoelectric transducer 110A for generating acoustical sound via a screen surface, in accordance with embodiments of the present disclosure. As shown in FIG. 2A, amplifier 112A, which may be configured as a voltage-controlled voltage source, may receive an input signal and generate an appropriate output signal based on the input signal in order to drive piezoelectric transducer 110A directly, or in some cases such as when a Class D or switching amplifier is used, via a matching/filter network. In turn, piezoelectric transducer 110A may be mechanically coupled to a screen (e.g., display 122 and/or transparent cover 134), and may cause mechanical movement/vibration of such screen in order to generate acoustical sound.

Figure 2B:
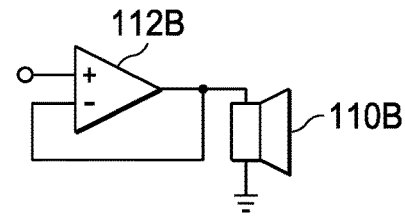
FIG. 2B illustrates a circuit diagram of an example amplifier and coil-based dynamic transducer for generating acoustical sound via a screen surface, in accordance with embodiments of the present disclosure.

FIG. 2B illustrates a circuit diagram of an example amplifier 112B and a mechanical transducer implemented as a coil-based dynamic transducer 110B for generating acoustical sound via a screen surface, in accordance with embodiments of the present disclosure. As shown in FIG. 2B, amplifier 112B, which may be configured as a voltage-controlled voltage source, may receive an input signal and generate an appropriate output signal based on the input signal in order to drive coil-based dynamic transducer 110B directly, or in some cases such as when a Class D or switching amplifier is used, via a matching/filter network. In turn, coil-based dynamic transducer 110B may be mechanically coupled to a screen (e.g., display 122 and/or transparent cover 134), and may cause mechanical movement/vibration of such screen in order to generate acoustical sound.

Although for purposes of clarity and exposition, amplifier 112 is depicted driving a mechanical transducer 110, in some embodiments of the present disclosure, amplifier 112 may drive a suitable load other than a mechanical transducer.

In operation, processor 103 may receive an indication of a physical quantity associated with the amplifier system comprising amplifier 112 and one or more other components of mobile device 102. In response to the indication, processor 103 may determine one or more parameters for operation of the amplifier system and cause the amplifier system to operate in accordance with the one or more parameters. In some embodiments, such physical quantity may comprise an estimated temperature associated with the amplifier system and the one or more parameters may comprise a frequency response of the amplifier system, as set forth in greater detail below with respect to FIGS. 3-5B below. In other embodiments, such physical quantity may comprise an estimated impedance associated with the amplifier system and the one or more parameters may comprise a selected amplifier configuration associated with the amplifier system, as set forth in greater detail below with respect to FIG. 6.

Figure 3:
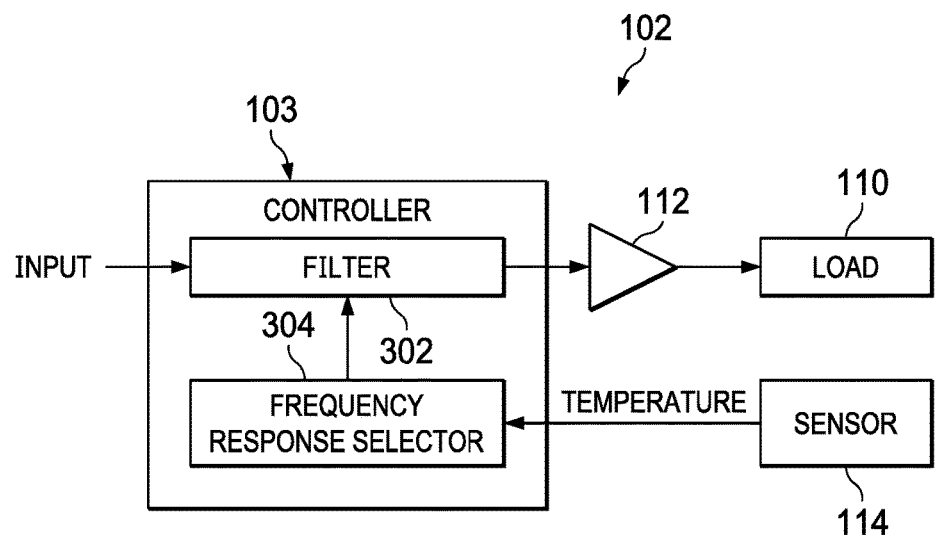
FIG. 3 illustrates selected portions of a mobile device including detail of selected components of a controller wherein a frequency response of an amplifier system is varied as a function of an estimated temperature associated with the amplifier system, in accordance with embodiments of the present disclosure.

FIG. 3 illustrates selected portions of mobile device 102 including detail of selected components of controller 103 wherein a frequency response of an amplifier system comprising amplifier 112 is varied as a function of an estimated temperature associated with the amplifier system, in accordance with embodiments of the present disclosure. As shown in FIG. 3, mobile device 102 may include a signal path for driving a load 110 (which may or may not comprise a mechanical transducer) wherein the signal path comprises amplifier 112 and a filter 302 (e.g., implemented by controller 103) having a variable frequency response, wherein the filter 302 may filter an input signal INPUT and output a filtered version of input signal INPUT to amplifier 112. Controller 103 may also implement a frequency response selector 304. Frequency response selector 304 may be configured to receive an electrical signal indicative of an estimated temperature sensed by sensor 114 and based on the estimated temperature, determine a selected frequency response of filter 302, such that the selected frequency response of filter 302 varies as a function of the estimated temperature. Accordingly, filter 302 effectively serves as an equalization filter that may equalize frequency response variations of the amplifier system caused by variances in temperature.

Figure 7:
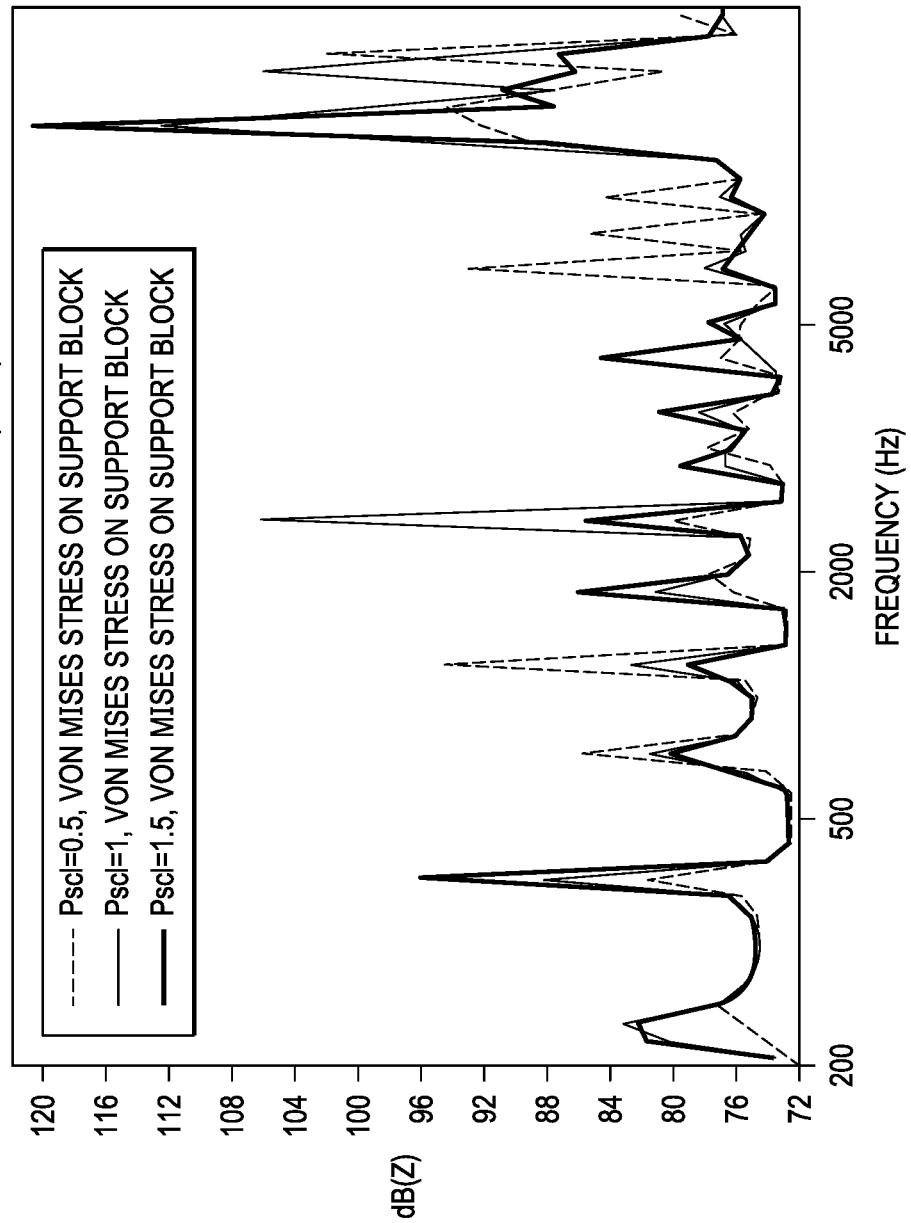
FIG. 7 illustrates a graph depicting a variation in frequency response of a piezoelectric transducer for three values of a dielectric constant corresponding to three different operating temperatures, as is known in the art.

For example, a desired reference stable frequency response for the audio system of mobile device 102 may be defined. For every measured frequency response at a selected temperature, filter 302 in connection with frequency response selector 304 may apply an inverse filter which when applied to input signal INPUT results in the desired reference response when the system is at the temperature associated with such inverse filter. The response of this filter may be a negative difference in decibels across frequency between the measured frequency response at the selected temperature (e.g., shown in FIG. 7) and the desired reference frequency response.

In some embodiments, frequency response selector 304 may be configured to calculate the selected frequency response as a function of estimated temperature. In other embodiments, a component of mobile device 102 (e.g., memory 104) may store a plurality of stored frequency responses, and frequency response selector 304 may select the selected frequency response from the plurality of stored frequency responses based on the estimated temperature (e.g., via a look-up table, which may also be stored in memory 104 or another component of mobile device 102). In some of such embodiments, not every estimated temperature may map directly to a stored frequency response, in which case frequency response selector 304 may select two frequency responses corresponding to the estimated temperature from the plurality of stored frequency responses and interpolate between the two selected frequency responses to set the selected frequency response.

Figure 4:
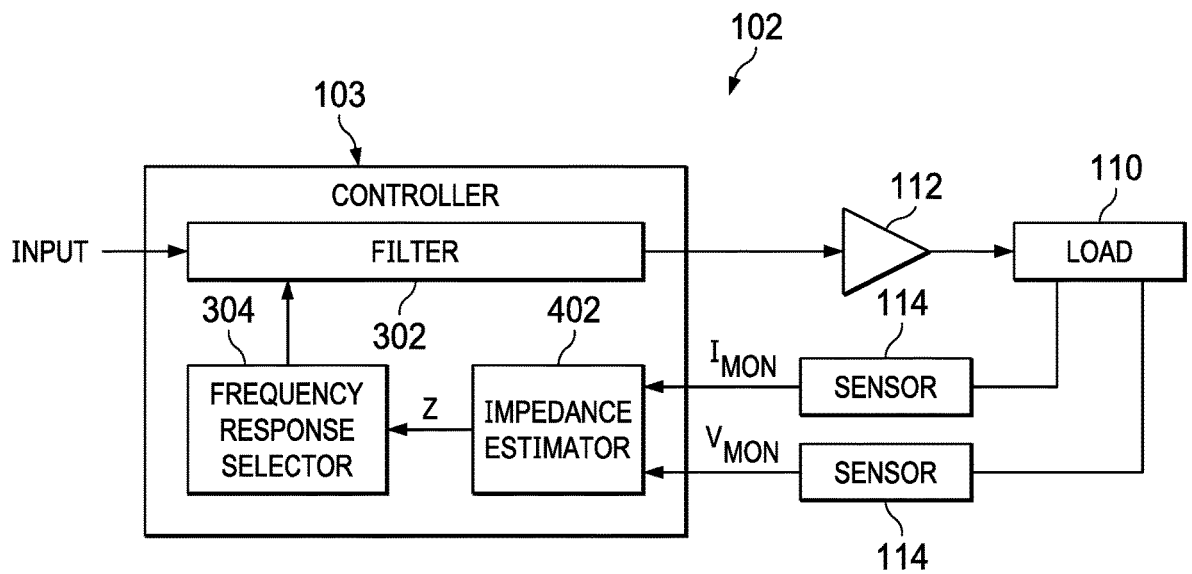
FIG. 4 illustrates selected portions of a mobile device including detail of selected components of a controller wherein a frequency response of an amplifier system is varied as a function of an estimated temperature associated with the amplifier system with the estimated temperature based on an estimated impedance of a load driven by the amplifier system, in accordance with embodiments of the present disclosure.

While FIG. 3 and the discussion thereof above contemplates determining an estimated temperature using a sensor 114, in some embodiments controller 103 may determine an estimated temperature by monitoring one or more physical quantities of load 110. For example, FIG. 4 illustrates selected portions of mobile device 102 including detail of selected components of controller 103 wherein a frequency response of an amplifier system comprising amplifier 112 is varied as a function of an estimated temperature associated with the amplifier system, with the estimated temperature based on an estimated impedance of load 110 driven by the amplifier system, in accordance with embodiments of the present disclosure. The embodiments represented by FIG. 4 may be similar in many respects to the embodiments represented by FIG. 3, and thus, only the main differences between FIG. 3 and FIG. 4 may be described below. In particular, the embodiments represented by FIG. 4 may include an impedance estimator 402 configured to receive a current monitoring signal $I_{MON}$ indicative of a current associated with load 110 (as sensed by a sensor 114 implemented as a current sensor) and a voltage monitoring signal $V_{MON}$ indicative of a voltage associated with load 110 (as sensed by a sensor 114 implemented as a voltage sensor) and based on such signals may determine an estimated impedance Z of load 110. If the impedance of load 110 varies monotonically with temperature, estimated impedance Z may serve as a proxy of an estimated temperature such that frequency response selector 304 may select a selected frequency response based on the estimated impedance, wherein the estimated impedance is indicative of an estimated temperature.

Figure 5A:
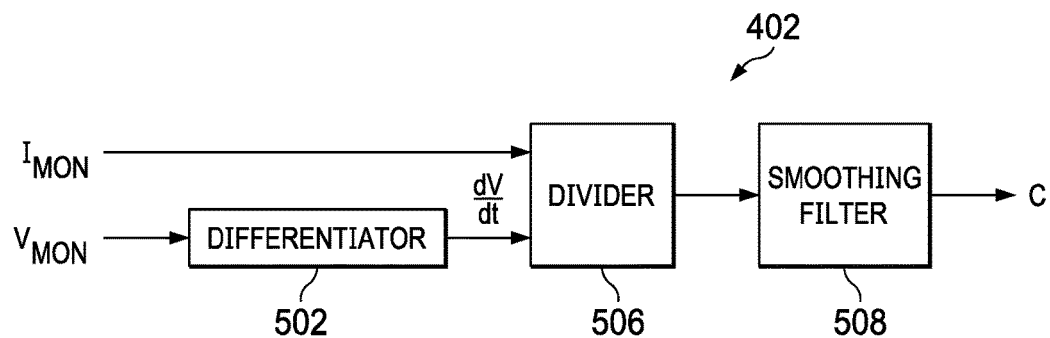
FIG. 5A illustrates a block diagram of selected components of an impedance estimator for estimating capacitance of a load driven by an amplifier, in accordance with embodiments of the present disclosure.
Figure 5B:
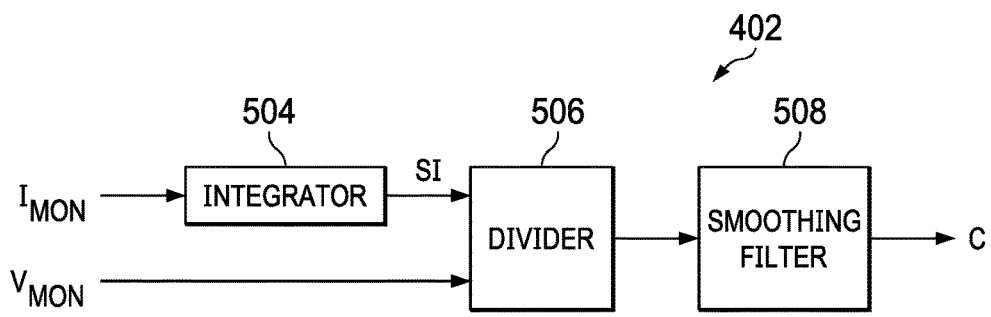
FIG. 5B illustrates a block diagram of selected components of another impedance estimator for estimating capacitance of a load driven by an amplifier, in accordance with embodiments of the present disclosure.

While the estimated impedance Z may be given as a resistance, impedance, capacitance, or complex impedance comprising non-reactive and reactive components, FIGS. 5A and 5B depict examples of impedance estimator 402 in which impedance estimator 402 estimates a capacitance of load 110. For example, as shown in FIG. 5A, in some embodiments, impedance estimator 402 may include a differentiator 502 to calculate a derivative with respect to time of voltage monitoring signal $V_{MON}$, shown as dV/dt in FIG. 5A. Impedance estimator 402 may also include a divider 506 configured to divide current monitoring signal $I_{MON}$ by the time-derivative of voltage monitoring signal $V_{MON}$ and a smoothing filter 508 to smooth the result of divider 506 in order to calculate an estimated capacitance C. As another example, as shown in FIG. 5B, in some embodiments, impedance estimator 402 may include an integrator 504 to calculate an integral with respect to time of current monitoring signal $I_{MON}$, shown as SI in FIG. 5B. Impedance estimator 402 may also include a divider 506 configured to divide the time-integral of current monitoring signal $I_{MON}$ by voltage monitoring signal $V_{MON}$ and a smoothing filter 508 to smooth the result of divider 506 in order to calculate an estimated capacitance C.

In other embodiments, impedance estimator 402 may include an adaptive impedance model, for example implemented with an infinite impulse response filter, state-variable filter, or other appropriate filter, whose parameters are determined by least-squares or other system identification techniques based on voltage monitoring signal $V_{MON}$ and current monitoring signal $I_{MON}$.

In yet other embodiments, impedance estimator 402 may be replaced with a frequency response estimator that may estimate a physical frequency response from voltage monitoring signal $V_{MON}$ and current monitoring signal $I_{MON}$ and adjusts frequency response selector 304 as appropriate to conform the audio system of mobile device 102 to a desired frequency response.

Figure 6:
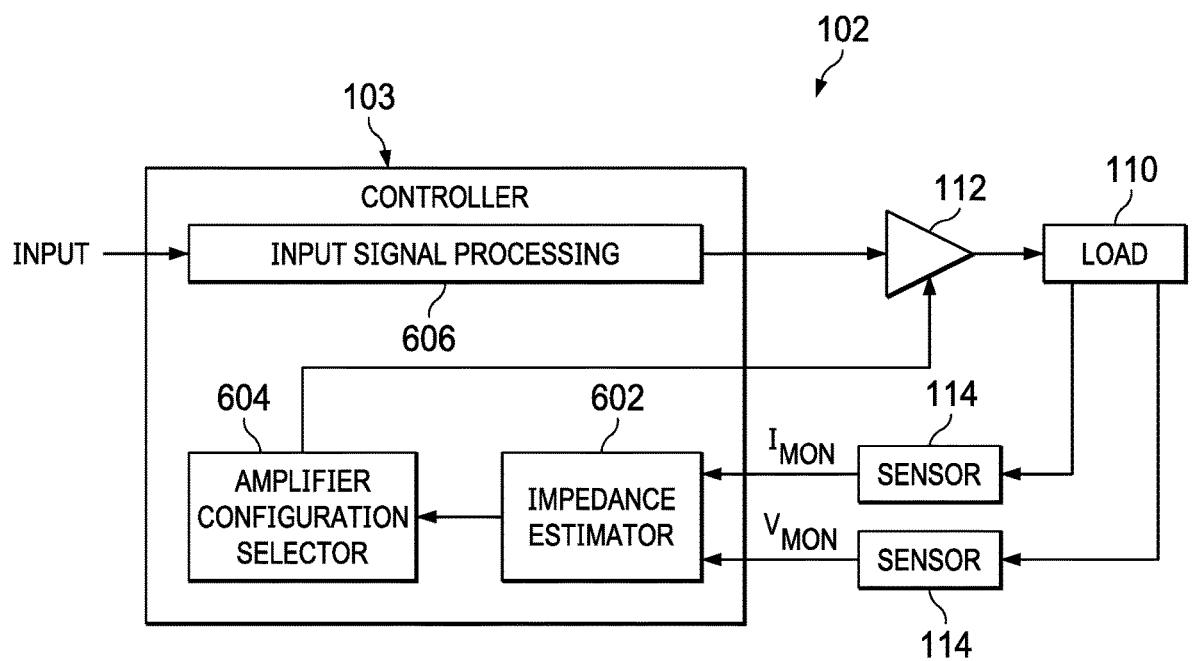
FIG. 6 illustrates selected portions of a mobile device including detail of selected components of a controller wherein a selected amplifier configuration of an amplifier system may be selected based on an estimated impedance of a load driven by the amplifier system, in accordance with embodiments of the present disclosure.

FIG. 6 illustrates selected portions of mobile device 102 including detail of selected components of controller 103 wherein a selected amplifier configuration of an amplifier system comprising amplifier 112 may be selected based on an estimated impedance of load 110 driven by the amplifier system, in accordance with embodiments of the present disclosure. As shown in FIG. 6, mobile device 102 may include a signal path for driving load 110 (which may or may not comprise a mechanical transducer) wherein the signal path comprises amplifier 112 and input signal processing 606. Input signal processing 606 may include any suitable processing for conditioning an input signal INPUT for amplification by amplifier 112. Controller 103 may also implement an impedance estimator 602 and an amplifier configuration selector 604.

Impedance estimator 602 may be configured to receive a current monitoring signal $I_{MON}$ indicative of a current associated with load 110 (as sensed by a sensor 114 implemented as a current sensor) and a voltage monitoring signal $V_{MON}$ indicative of a voltage associated with load 110 (as sensed by a sensor 114 implemented as a voltage sensor) and based on such signals may determine an estimated impedance Z of load 110. Such estimated impedance Z may be given as a resistance, impedance, capacitance, or complex impedance comprising non-reactive and reactive components. In these and other embodiments, such estimated impedance Z may be given as coefficients of a filter model such as an infinite impulse response filter, state-variable filter, or other suitable filter.

Amplifier configuration selector 604 may be configured to receive an electrical signal indicative of an estimated impedance and based on the estimated impedance, determine a selected amplifier configuration associated with the amplifier system comprising amplifier 112.

In other embodiments, a component of mobile device 102 (e.g., memory 104) may store a plurality of amplifier configurations and amplifier configuration selector 604 may select the selected amplifier configuration from the plurality of selected amplifier configurations based on the estimated impedance (e.g., via a look-up table, which may also be stored in memory 104 or another component of mobile device 102). In some of such embodiments, not every estimated impedance may map directly to a stored amplifier configuration, in which case amplifier configuration selector 604 may select two frequency responses corresponding to the estimated impedance from the plurality of stored amplifier configurations and interpolate between the two selected amplifier configurations to set the selected amplifier configuration.

The selected amplifier configuration may define one or more of a boost headroom associated with the amplifier system, an amplifier gain of amplifier 112, amplifier compensation network parameters for amplifier 112, and a frequency response of the amplifier system (e.g., either via a filter internal to amplifier 112 or input signal processing 606). In some embodiments, an amplifier configuration may be implemented by coefficients of an equalization filter internal or external (e.g., within input signal processing 606) to amplifier 112, wherein a response of such equalization filter is applied to an audio signal being amplified by amplifier 112.

In some embodiments, the estimated impedance may comprise an estimated resistance of load 110, and amplifier configuration selector 604 may vary an amplifier gain of amplifier 112 as a function of the estimated resistance. In these and other embodiments, the estimated impedance may comprise an estimated inductance of load 110, and amplifier configuration selector 604 may vary a frequency response of the amplifier system as a function of the estimated inductance. In these and other embodiments, the estimated capacitance may include an estimated inductance of the transducer, and amplifier configuration selector 604 may vary a frequency response of the amplifier system as a function of the estimated capacitance.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A method for controlling one or more parameters of an amplifier system comprising:
   receiving an indication of an estimated temperature associated with the amplifier system;
   determining one or more parameters of the amplifier system in response to the indication wherein:
   the one or more parameters comprise a selected frequency response of the amplifier system, such that the selected frequency response of the amplifier system varies as a function of the estimated temperature; and
   determining the one or more parameters of the amplifier system in response to the indication comprises selecting the selected frequency response corresponding to the estimated temperature from a plurality of stored frequency responses; and causing the amplifier system to operate in accordance with the one or more parameters.

2. The method of claim 1, wherein determining the one or more parameters of the amplifier system in response to the indication comprises:

selecting two frequency responses corresponding to the estimated temperature from a plurality of stored frequency responses; and interpolating between the two selected frequency responses to set the selected frequency response.

3. The method of claim 1, wherein determining the one or more parameters of the amplifier system in response to the indication comprises calculating the selected frequency response based on the estimated temperature.

4. The method of claim 1, wherein the amplifier system comprises a digital signal processor and a transducer amplifier.

5. The method of claim 1, wherein the amplifier system comprises an equalizer stage and a transducer amplifier.

6. A method for controlling one or more parameters of an amplifier system comprising:

receiving an indication of an estimated impedance associated with the amplifier system;

determining one or more parameters of the amplifier system in response to the indication; and causing the amplifier system to operate in accordance with the one or more parameters.

7. The method of claim 6, wherein the one or more parameters comprise a selected amplifier configuration associated with the amplifier system.

8. The method of claim 7, wherein the selected amplifier configuration defines one or more of a boost headroom associated with the amplifier system, an amplifier gain, amplifier compensation network parameters, and a frequency response of the amplifier system.

9. The method of claim 7, wherein determining the one or more parameters of the amplifier system in response to the indication comprises selecting the selected amplifier configuration corresponding to the estimated impedance from a plurality of stored amplifier configurations.

10. The method of claim 7, wherein determining the one or more parameters of the amplifier system in response to the indication comprises:

selecting two amplifier configurations corresponding to the estimated impedance from a plurality of stored amplifier configurations; and interpolating between the two amplifier configurations to set the selected amplifier configuration.

11. The method of claim 7, wherein the estimated impedance is an impedance of a transducer driven by the amplifier system.

12. The method of claim 11, wherein the estimated impedance comprises an estimated resistance of the transducer, and wherein an amplifier gain of the amplifier system is varied as a function of the estimated resistance.

13. The method of claim 11, wherein the estimated impedance comprises an estimated inductance of the transducer, and wherein a frequency response of the amplifier system is varied as a function of the estimated inductance.

14. The method of claim 11, wherein the estimated impedance comprises an estimated capacitance of the transducer, and wherein a frequency response of the amplifier system is varied as a function of the estimated capacitance.

15. An apparatus for controlling one or more parameters of an amplifier system comprising:

at least one input configured to receive an estimated temperature associated with the amplifier system; and a controller configured to:

determine one or more parameters of the amplifier system in response to the indication, wherein the one or more parameters comprises a selected frequency response of the amplifier system, such that the selected frequency response of the amplifier system varies as a function of the estimated temperature, wherein determining the one or more parameters of the amplifier system in response to the indication comprises selecting the selected frequency response corresponding to the estimated temperature from a plurality of stored frequency responses; and cause the amplifier system to operate in accordance with the one or more parameters.

16. The apparatus of claim 15, wherein determining the one or more parameters of the amplifier system in response to the indication comprises:

selecting two frequency responses corresponding to the estimated temperature from a plurality of stored frequency responses; and interpolating between the two selected frequency responses to set the selected frequency response.

17. The apparatus of claim 15, wherein determining the one or more parameters of the amplifier system in response to the indication comprises calculating the selected frequency response based on the estimated temperature.

18. The apparatus of claim 15, wherein the amplifier system comprises a digital signal processor and a transducer amplifier.

19. The apparatus of claim 15, wherein the amplifier system comprises an equalizer stage and a transducer amplifier.

20. An apparatus for controlling one or more parameters of an amplifier system comprising:

at least one input configured to receive an indication of an estimated impedance associated with the amplifier system; and a controller configured to:

determine one or more parameters of the amplifier system in response to the indication; and cause the amplifier system to operate in accordance with the one or more parameters.

21. The apparatus of claim 20, wherein the one or more parameters comprise a selected amplifier configuration associated with the amplifier system.

22. The apparatus of claim 21, wherein the selected amplifier configuration defines one or more of a boost headroom associated with the amplifier system, an amplifier gain, amplifier compensation network parameters, and a frequency response of the amplifier system.

23. The apparatus of claim 21, wherein determining the one or more parameters of the amplifier system in response to the indication comprises selecting the selected amplifier configuration corresponding to the estimated impedance from a plurality of stored amplifier configurations.

24. The apparatus of claim 21, wherein determining the one or more parameters of the amplifier system in response to the indication comprises:

selecting two amplifier configurations corresponding to the estimated impedance from a plurality of stored amplifier configurations; and interpolating between the two amplifier configurations to set the selected amplifier configuration.

25. The apparatus of claim 21, wherein the estimated impedance is an impedance of a transducer driven by the amplifier system.

26. The apparatus of claim 25, wherein the estimated impedance comprises an estimated resistance of the transducer, and wherein an amplifier gain of the amplifier system is varied as a function of the estimated resistance.

27. The apparatus of claim 25, wherein the estimated impedance comprises an estimated inductance of the transducer, and wherein a frequency response of the amplifier system is varied as a function of the estimated inductance.

28. The apparatus of claim 25, wherein the estimated impedance comprises an estimated capacitance of the transducer, and wherein a frequency response of the amplifier system is varied as a function of the estimated capacitance.

* * * * *